United States Patent
Srinivasan et al.

(10) Patent No.: US 10,527,672 B2
(45) Date of Patent: Jan. 7, 2020

(54) VOLTAGE REGULATOR BYPASS CIRCUITRY USABLE DURING DEVICE TESTING OPERATIONS

(71) Applicant: STMicroelectronics International N.V., Schiphol (NL)

(72) Inventors: Venkata Narayanan Srinivasan, Gautam Budh Nagar District (IN); Srinivas Dhulipalla, Prakasam (IN)

(73) Assignee: STMicroelectronics International N.V., Schiphol (NL)

( * ) Notice: Subject to any disclaimer, the term of this patent is extended or adjusted under 35 U.S.C. 154(b) by 188 days.

(21) Appl. No.: 15/713,168

(22) Filed: Sep. 22, 2017

(65) Prior Publication Data

US 2019/0094296 A1 Mar. 28, 2019

(51) Int. Cl.
*G01R 31/28* (2006.01)
*H03K 19/20* (2006.01)

(52) U.S. Cl.
CPC ..... *G01R 31/2896* (2013.01); *G01R 31/2886* (2013.01); *H03K 19/20* (2013.01)

(58) Field of Classification Search
CPC . G01R 31/2896; G01R 31/2886; H03K 19/20
See application file for complete search history.

(56) References Cited

U.S. PATENT DOCUMENTS

| | | | | | |
|---|---|---|---|---|---|
| 8,044,536 | B2* | 10/2011 | Nguyen | ..................... | H02J 1/08 307/32 |
| 2009/0085726 | A1* | 4/2009 | Radtke | ..................... | H04B 3/56 375/258 |
| 2009/0167088 | A1* | 7/2009 | Llorente Gonzalez | ..................... | H02J 3/1814 307/60 |
| 2012/0331362 | A1* | 12/2012 | Tekumalla | ..... | G01R 31/318552 714/731 |
| 2013/0321071 | A1* | 12/2013 | Pietri | ..................... | H03K 17/22 327/540 |
| 2014/0118036 | A1* | 5/2014 | Pietri | ..................... | H03K 17/22 327/143 |
| 2014/0139197 | A1* | 5/2014 | Price | ..................... | G05F 1/56 323/280 |
| 2015/0316586 | A1* | 11/2015 | Hammerschmidt | ... | G01R 17/06 324/99 R |
| 2016/0091907 | A1* | 3/2016 | Su | ..................... | G05F 1/46 323/280 |
| 2016/0336753 | A1* | 11/2016 | Kam | ..................... | H02J 3/383 |

(Continued)

*Primary Examiner* — Dominic E Hawkins
(74) *Attorney, Agent, or Firm* — Crowe & Dunlevy

(57) ABSTRACT

Disclosed herein is circuitry for bypassing a medium voltage regulator during testing. The circuitry includes a low voltage regulator to, in operation, generate a first voltage within a first voltage range for powering first circuitry, and a medium voltage regulator to, in operation, generate a second voltage within a second voltage range greater than the first voltage range for powering second circuitry. A low voltage regulator bypass circuit generates a low voltage regulator bypass signal that operates to selectively bypass the low voltage regulator. A medium voltage regulator bypass circuit bypasses the medium voltage regulator as a function of the low voltage regulator bypass signal and an external voltage regulator select signal, the bypass of the medium voltage regulator being such that an external voltage can be applied to the second circuitry.

21 Claims, 2 Drawing Sheets

(56) References Cited

U.S. PATENT DOCUMENTS

2017/0185094 A1* 6/2017 Atkinson .................. G05F 1/59
2017/0250542 A1* 8/2017 Panosyan .................. H02J 3/12

* cited by examiner

VOLTAGE REGULATOR BYPASS CIRCUITRY USABLE DURING DEVICE TESTING OPERATIONS

TECHNICAL FIELD

This disclosure is directed to the field of circuit packages, and, in particular, to bypass circuitry permitting bypass of one or more selected voltage regulators within a circuit package during testing operations.

BACKGROUND

Circuit packages, such as systems on a chip, multi-chip modules, and integrated circuit packages, may include multiple voltage regulators. Each of these voltage regulators may produce a different voltage for powering respective different portions of their circuit packages during normal operation. For example, in some instances, a voltage regulator generating an output voltage in a first range may be used for powering memory cells, while a voltage regulator generating an output voltage in a second range may be used for powering CPU cores, and a voltage regulator generating an output voltage in a third range may be used for powering input/output circuits.

For testing of these circuit packages after fabrication (e.g. production testing), or by a customer (e.g. customer testing), it may be desirable to be able to disable the in-package voltage regulators so as to permit external supply voltages to be applied using a test tool.

Accordingly, the development of voltage regulator bypass circuitry usable in such circuit packages is necessary.

SUMMARY

Disclosed herein is circuitry for bypassing a medium voltage regulator during testing. The circuitry includes a low voltage regulator configured to, in operation, generate a first voltage within a first voltage range for powering first circuitry, and a medium voltage regulator configured to, in operation, generate a second voltage within a second voltage range greater than the first voltage range for powering second circuitry. A low voltage regulator bypass circuit is configured to generate a low voltage regulator bypass signal that operates to selectively bypass the low voltage regulator. A medium voltage regulator bypass circuit is configured to bypass the medium voltage regulator as a function of the low voltage regulator bypass signal and an external voltage regulator select signal, the bypass of the medium voltage regulator being such that an external voltage can be applied to the second circuitry.

The medium voltage regulator bypass circuit may be configured to not bypass the medium voltage regulator as a function of the low voltage regulator bypass signal being asserted and the external voltage regulator select signal being asserted. In addition, the low voltage regulator bypass circuit may bypass the low voltage regulator as a function of the low voltage regulator bypass signal being asserted.

The medium voltage regulator bypass circuit may be configured to bypass the medium voltage regulator as a function of the low voltage regulator bypass signal being asserted and the external voltage regulator select signal being deasserted. In addition, the low voltage regulator bypass circuit may bypass the low voltage regulator as a function of the low voltage regulator bypass signal being asserted.

The medium voltage regulator bypass circuit may be configured to not bypass the medium voltage regulator as a function of the low voltage regulator bypass signal being deasserted and the external voltage regulator select signal being deasserted, and the low voltage regulator bypass circuit may not bypass the low voltage regulator as a function of the low voltage regulator bypass signal being deasserted and the external voltage regulator select signal being deasserted.

The low voltage regulator bypass circuit may include an OR gate configured to receive as input the low voltage regulator bypass signal and the external voltage regulator select signal and to provide output to a power down terminal of the low voltage regulator.

The medium voltage regulator bypass circuit may include an inverter configured to receive as input the external voltage regulator select signal, and an AND gate configured to receive as input an inverted version of the external voltage regulator select signal from the inverter and the low voltage regulator bypass signal, and to provide output to a power down terminal of the medium voltage regulator.

The medium voltage regulator bypass circuit may be configured to not bypass the medium voltage regulator as a function of the low voltage regulator bypass signal being deasserted and the external voltage regulator select signal being asserted, and the low voltage regulator bypass circuit may bypass the low voltage regulator as a function of the external voltage regulator select signal being asserted.

The second voltage range may be insufficient to permit testing of the second circuitry using a test tool, and the external voltage may be received from a test device and has a third voltage in a third voltage range wider than the second voltage range (i.e. the third voltage range can vary from less than second voltage range while remaining higher than first voltage range to greater than second voltage range).

The medium voltage regulator may not receive a medium voltage regulator bypass signal that is based upon signals other than the low voltage regulator bypass signal and the external voltage regulator select signal.

At least one additional voltage regulator may be configured to, in operation, generate a voltage, and the low voltage regulator bypass signal may also operate to selectively bypass the at least one additional voltage regulator.

A method aspect is disclosed herein. The method includes selectively bypassing a low voltage regulator and a medium voltage regulator by forcing an external voltage regulator select signal to a second logic value using a test tool, forcing a low voltage regulator bypass signal to a first logic value using a test tool, and applying an external voltage that is wider in range than the voltage range producible by a medium voltage regulator to an external voltage pad to power circuitry coupled to the medium voltage regulator, and testing the circuitry, if the first logic value is a logic high and the second logic value is a logic low.

A medium voltage regulator bypass signal that is based upon signals other than the low voltage regulator bypass signal and the external voltage regulator select signal is not applied to the medium voltage regulator.

DETAILED DESCRIPTION

Figure 1:
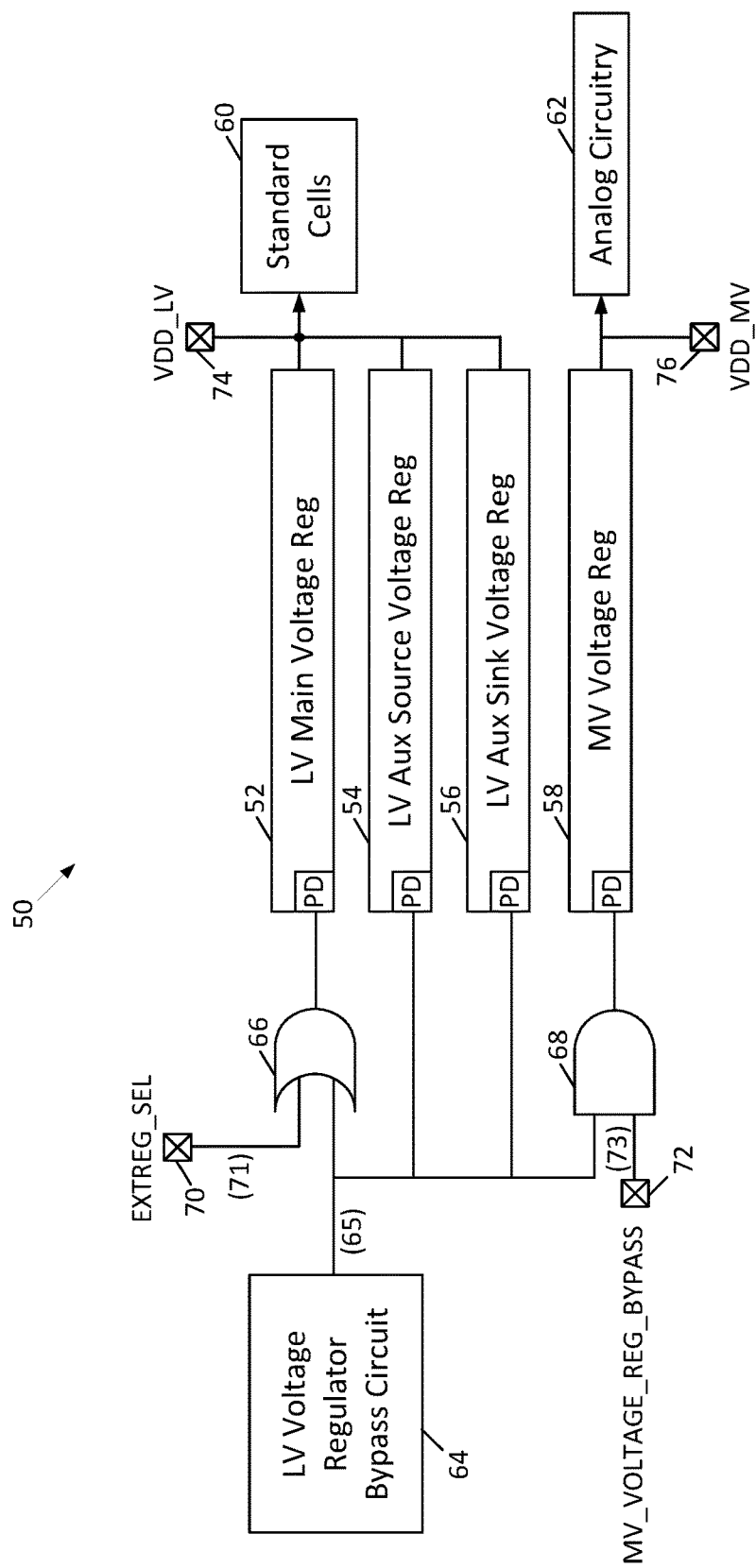
FIG. 1 is a schematic diagram of voltage regulator bypass circuitry integrated within a circuit package and necessitating the use of separate pins (and related signals) for each voltage regulator that is to be bypassed, usable during test operations.

The drawing figures and the following description relate to preferred embodiments by way of illustration only. It should be noted that from the following discussion, alternative embodiments of the structures and methods disclosed herein will be readily recognized as viable alternatives that may be employed without departing from the principles of the embodiments.

Reference will now be made in detail to several embodiments, examples of which are illustrated in the accompanying figures. It is noted that wherever practicable, similar or like reference numbers may be used in the figures and may indicate similar or like functionality. The figures depict embodiments for purposes of illustration only. As described herein, a "replica" transistor has a same length and width as the transistor it replicates, or has substantially similar or substantially identical electrical properties as the transistor it replicates.

With initial reference to FIG. 1, a circuit package 50 is now described. The circuit package 50 includes first and second sets of circuits 60 and 62. Circuit 60 is depicted as standard memory cells, while circuit 62 is depicted as analog circuitry, although it should be understood that these circuits 60 and 62 may be any appropriate component situated within the circuit package 50.

A low voltage (LV) main regulator 52 is coupled to provide power to the circuit 60. A low voltage auxiliary source regulator 54 is coupled to provide extra power to the circuit 60 in the instance where the voltage provided by the low voltage main regulator 52 experiences a sudden drop. Likewise, a low voltage auxiliary sink regulator 56 is coupled to sink power from the circuit 60 in the instance where the voltage provided by the low voltage main regulator 52 experiences a sudden increase.

A medium voltage (MV) regulator 58 is coupled to provide power to the circuit 62. The medium voltage regulator 58 provides an output voltage to the circuit 62 in a voltage range that is greater than that produced by the low voltage main regulator 52.

An OR gate 66 receives input from a low voltage regulator bypass circuit 64 and an external regulator select signal Extreg_Sel 71 from an EXTREG_SEL pin 70, and provides output to a powerdown PD or reset terminal of the low voltage main regulator 52. An AND gate 68 receives input from the low voltage regulator bypass circuit 64 as well as a medium voltage regulator bypass signal Mv_Voltage_Reg_Bypass 73 from a MV_VOLTAGE_REG_BYPASS pin 72, and provides output to a powerdown PD or reset terminal of the medium voltage regulator 58.

It is noted that the low voltage regulator bypass circuit 64 is also coupled to provide output to the powerdown PD or reset terminals of the low voltage auxiliary source regulator 54 and the low voltage auxiliary sink regulator 56.

In a test scenario where it is desired to power down or bypass the low voltage regulators 52, 54, 56, the low voltage regulator bypass circuit 64 can be activated. This activation is via application of a specific supply sequence from a tester at power-up. This functions by forcing a lower level on a non-volatile memory program/erase supply pad from test equipment (9 v is used for programming/erase, but 5 v is provided on this pad so that non-volatile memory contents remain intact, but bypass circuitry functions as it is biased with this equivalent voltage level). Next a low voltage is forced on VDD_LV 74 from the tester power source (at this point of time low voltage regulators 52, 54, 56 are OFF), and then the bias voltage of the LV voltage regulator bypass circuit is forced to a high voltage (in fourth voltage range higher above the first, second and third voltage range mentioned earlier) to produce an asserted output signal 65, which either through direct coupling in the case of the low voltage auxiliary source regulator 54 and the low voltage auxiliary sink regulator 56, or through indirect coupling in the case of the low voltage main regulator 52 (through causing the OR gate 66 to assert its output), serves to place the regulators 52, 54, 56 in a powerdown or bypass mode. If desired for a given test being run, the circuit 60 may be powered by the suitable low voltage applied from a tester to the low voltage supply pin VDD_LV 74, which is coupled to the circuit 60 (this is already performed during the LV bypass sequence itself, as explained above).

If, during this test, it is further desired to power down or bypass the medium voltage regulator 58, an asserted MV_Voltage_Reg_Bypass signal 73 may be provided from a tester to the MV_VOLTAGE_REG_BYPASS pin 72. Since the low voltage regulator bypass circuit 64 is also providing its asserted output signal 65, this results in the AND gate 68 asserting its output, placing the medium voltage regulator 58 in a powerdown or bypass mode. The medium voltage may then, if desired, be applied from a tester to a medium voltage supply pin VDD_MV 76, which is coupled to circuit 62.

If, during the test, it is instead not desired to power down or bypass the medium voltage regulator 58, a deasserted MV_Voltage_Reg_Bypass signal 73 is provided from a tester to the MV_VOLTAGE_REG_BYPASS pin 72. Thus, the AND gate 68 will deassert its output, leaving the medium voltage regulator 58 in a powered on mode.

If the source and sink capacity of the regulators 54 and 56 is desired during testing, so as to account for a sudden increase or decrease in load, the low voltage regulator bypass circuit 64 may instead remain deactivated, leaving the regulators 54 and 56 in a powered on mode, and the external regulator select signal Extreg_Sel 71 may be forced high through application of a suitable signal to the EXTREG_SEL pin 70.

Naturally, if so desired, the low voltage regulator bypass circuit 64 can remain deactivated, and the Mv_Voltage_Reg_Bypass signal 73 and the Extreg_Sel signal 71 can remain deasserted, thereby maintaining the regulators 52, 54, 56, 58 in a powered on mode for testing.

While the above described arrangement allows for the selection of which among the regulators 52, 54, 56, and 58 is to be bypassed or powered down, and for the selection of which is to remain powered on, it is noted that the circuit package 50 requires two external pins, the EXTREG_SEL pin 70 and MV_VOLTAGE_REG_BYPASS pin 72. This requirement for two additional pins may be undesirable for a variety of reasons.

Therefore, the Inventors have developed the arrangement in circuit package 50' (now described with reference to FIG. 2) in which only one additional pin is needed. Here, the OR gate 66 still receives input from the low voltage regulator bypass circuit 64 and the external regulator select signal Extreg_Sel 71 at EXTREG_SEL pin 70, and provides output to the powerdown PD or reset terminal of the low voltage main regulator 52. However, here an inverter 67 is added to produce an inverted version of the Extreg_Sel signal 71. Also, here, the AND gate 68 receives input from the low voltage regulator bypass circuit 64 as well as the inverted version of the Extreg_Sel signal 71 from the inverter 67, and provides output to the powerdown PD or reset terminal of the medium voltage main regulator 58.

As with the configuration of FIG. 1, in a test scenario where it is desired to power down or bypass the low voltage regulators 52, 54, 56, the low voltage regulator bypass circuit 64 can be activated to produce an asserted output signal 65, which either through direct coupling in the case of the low voltage auxiliary source regulator 54 and the low voltage auxiliary sink regulator 56, or through indirect coupling in the case of the low voltage main regulator 52 (through causing the OR gate 66 to assert its output), serves to place the regulators 52, 54, 56 in a powerdown or bypass mode. If desired for a given test being run, the circuit 60 may be powered by the suitable low voltage applied from a tester to the low voltage supply pin VDD_LV 74 (this is already performed during the LV bypass sequence itself, as mentioned above).

However, here, if it is desired to bypass the medium voltage regulator 58, a deasserted Extreg_Sel signal 71 may be applied to the EXTREG_SEL pin 70 from a tester, which, after passing through the inverter 57, will result in the AND gate 68 asserting its output to place the medium voltage regulator 58 in a powerdown or bypass mode (only if the LV_Reg_Bypass signal 65 is also asserted).

If it is instead desired for the medium voltage regulator 58 to remain operational during testing, then an asserted Extreg_Sel signal 71 may be applied to the EXTREG_SEL pin 70 from the tester, which, after passing through the inverter 57, will result in the AND gate 68 deasserting its output to permit the medium voltage regulator 58 to remain powered on.

In addition, if the source and sink capacity of the regulators 54 and 56 is desired during testing, so as to account for a sudden increase or decrease in load, the low voltage regulator bypass circuit 64 may instead remain deactivated, leaving the regulators 54 and 56 in a powered on mode, and the Extreg_Sel signal 71 may be forced high through application of a suitable signal 71 to the EXTREG_SEL pin 70.

Also, if so desired, the low voltage regulator bypass circuit 64 can remain deactivated, and the Extreg_Sel signal 71 can remain deasserted, thereby maintaining the regulators 52, 54, 56, 58 in a powered on mode for testing.

Figure 2:
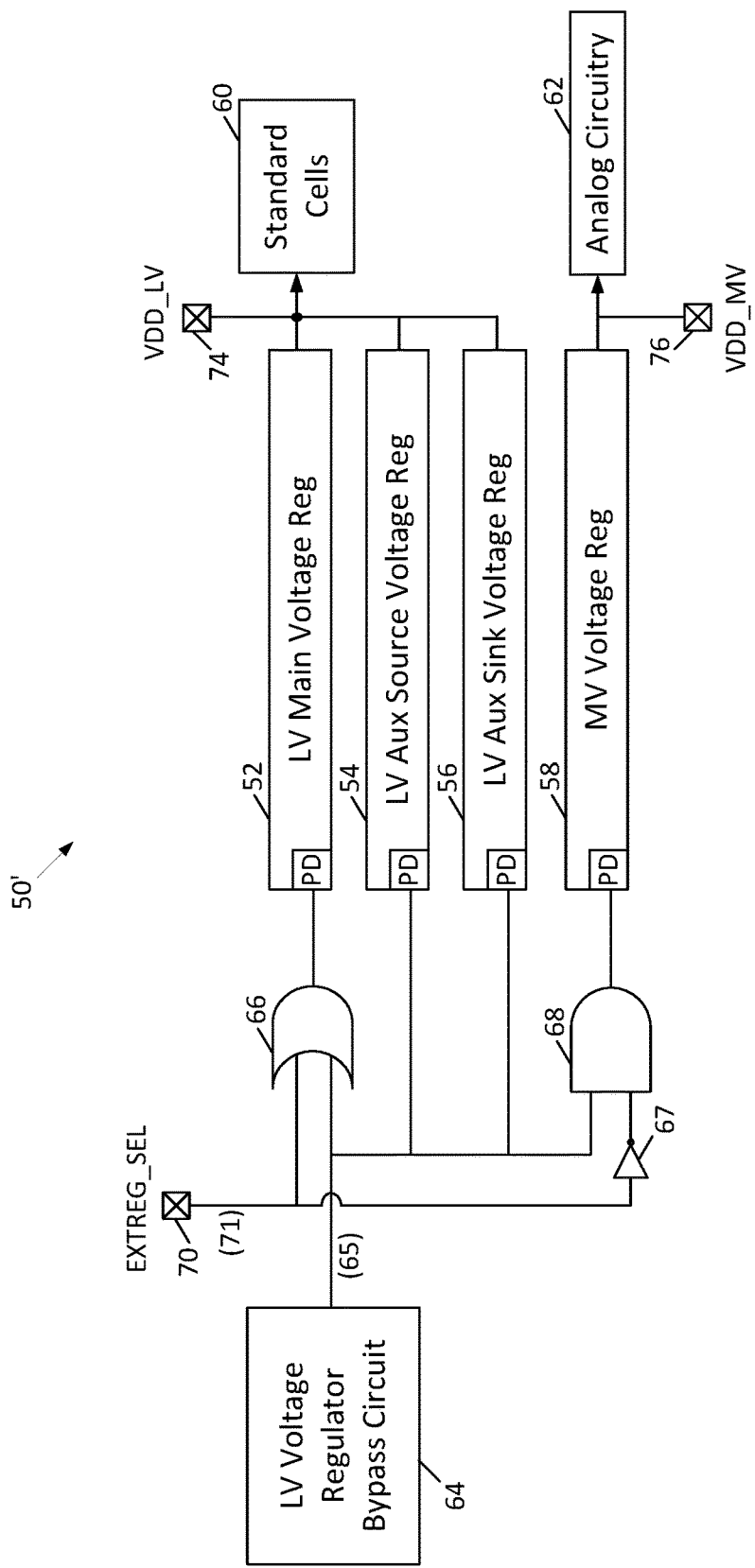
FIG. 2 is a schematic diagram of voltage regulator bypass circuitry integrated within a circuit package and utilizing a single pin (and related signal) for multiple voltage regulators that are to be bypassed, usable during test operations.

Therefore, the circuit package 50' described with reference to FIG. 2 maintains the same functionality as the circuit package described with reference to FIG. 1, yet eliminates the need for a medium voltage regulator bypass signal MV_Voltage_Reg_Bypass 72 and corresponding pin 72. This can be used to reduce the total pin count of the circuit package 50', or to provide additional space for another pin to be added, such as a general purpose input output pin.

Upon reading this disclosure, those of ordinary skill in the art will appreciate still additional alternative structural and functional designs through the disclosed principles of the embodiments. Thus, while particular embodiments and applications have been illustrated and described, it is to be understood that the embodiments are not limited to the precise construction and components disclosed herein and that various modifications, changes and variations which will be apparent to those skilled in the art may be made in the arrangement, operation and details of the method and apparatus disclosed herein without departing from the spirit and scope as defined in the appended claims.

The invention claimed is:

1. Circuitry for bypassing a medium voltage regulator during testing, the circuitry comprising:
    a low voltage regulator configured to, in operation, generate a first voltage within a first voltage range for powering first circuitry;
    a medium voltage regulator configured to, in operation, generate a second voltage within a second voltage range greater than the first voltage range for powering second circuitry;
    a low voltage regulator bypass circuit configured to generate a low voltage regulator bypass signal for selectively bypassing the low voltage regulator by placing the low voltage regulator in a powered down or reset state;
    a medium voltage regulator bypass circuit configured to selectively bypass the medium voltage regulator by placing the medium voltage regulator in a powered down or reset state so that an external voltage can be applied to the second circuitry, the medium voltage regulator bypass circuit selectively bypassing the medium voltage regulator as a function of the low voltage regulator bypass signal and an external voltage regulator select signal.

2. The circuitry of claim 1, wherein the medium voltage regulator bypass circuit is configured to not bypass the medium voltage regulator if the low voltage regulator bypass signal is asserted and the external voltage regulator select signal is being asserted.

3. The circuitry of claim 2, wherein the low voltage regulator bypass circuit bypasses the low voltage regulator if the low voltage regulator bypass signal is asserted.

4. The circuitry of claim 1, wherein the medium voltage regulator bypass circuit is configured to bypass the medium voltage regulator if the low voltage regulator bypass signal is asserted and the external voltage regulator select signal is deasserted.

5. The circuitry of claim 4, wherein the low voltage regulator bypass circuit bypasses the low voltage regulator if the low voltage regulator bypass signal is asserted.

6. The circuitry of claim 1, wherein the medium voltage regulator bypass circuit is configured to not bypass the medium voltage regulator if the low voltage regulator bypass signal is deasserted and the external voltage regulator select signal is deasserted; and wherein the low voltage regulator bypass circuit does not bypass the low voltage regulator if the low voltage regulator bypass signal is deasserted and the external voltage regulator select signal is deasserted.

7. The circuitry of claim 1, wherein the low voltage regulator bypass circuit comprises:
    an OR gate configured to receive as input the low voltage regulator bypass signal and the external voltage regulator select signal and to provide output to a power down terminal of the low voltage regulator.

8. The circuitry of claim 1, wherein the medium voltage regulator bypass circuit comprises:
    an inverter configured to receive as input the external voltage regulator select signal; and
    an AND gate configured to receive as input an inverted version of the external voltage regulator select signal from the inverter and the low voltage regulator bypass signal, and to provide output to a power down terminal of the medium voltage regulator.

9. The circuitry of claim 1, wherein the medium voltage regulator bypass circuit is configured to not bypass the medium voltage regulator if the low voltage regulator bypass signal is deasserted and the external voltage regulator select signal is asserted; and wherein the low voltage regulator bypass circuit bypasses the low voltage regulator if the external voltage regulator select signal is asserted.

10. The circuitry of claim 1, wherein the second voltage range is insufficient to permit testing of the second circuitry using a test tool; wherein the external voltage is received from a test device and has a third voltage in a third voltage range wider than the second voltage range.

11. The circuitry of claim 1, wherein the medium voltage regulator does not receive a medium voltage regulator bypass signal that is based upon signals other than the low voltage regulator bypass signal and the external voltage regulator select signal.

12. The circuitry of claim 1, further comprising at least one additional voltage regulator configured to, in operation, generate a voltage; and wherein the low voltage regulator bypass signal is also for selectively bypassing the at least one additional voltage regulator.

13. A method of testing an integrated circuit, the method comprising:
   selectively bypassing a low voltage regulator and a medium voltage regulator by:
      forcing an external voltage regulator select signal to a second logic value using a test tool;
      forcing a low voltage regulator bypass signal to a first logic value using the test tool; and
      applying an external voltage that is wider in range than a voltage range producible by a medium voltage regulator to an external voltage pad to power circuitry coupled to the medium voltage regulator and testing the circuitry.

14. The method of claim 13, wherein a medium voltage regulator bypass signal that is based upon signals other than the low voltage regulator bypass signal and the external voltage regulator select signal is not applied to the medium voltage regulator.

15. A circuit, comprising:
   a first voltage regulator having a power down terminal and an output coupled to first circuitry;
   a second voltage regulator having a power down terminal and an output coupled to second circuitry;
   a first voltage regulator bypass circuit having an input terminal and an output terminal;
   an OR gate having inputs coupled to an external regulator select terminal and the output terminal of the first voltage regulator bypass circuit, and an output coupled to the power down terminal of the first voltage regulator;
   an inverter having an input coupled to the external regulator select terminal; and
   an AND gate having inputs coupled to the output of the inverter and the output terminal of the first voltage regulator bypass circuit, and an output coupled to the power down terminal of the second voltage regulator.

16. The circuit of claim 15, wherein the first voltage regulator is configured to generate a first voltage; and wherein the second voltage regulator is configured to generate a second voltage greater than the first voltage.

17. The circuit of claim 16, further comprising an external voltage terminal coupled to the second circuitry to receive an external voltage from a test tool that is wider in range than the second voltage.

18. The circuit of claim 15, further comprising an external voltage terminal coupled to the second circuitry.

19. Circuitry for bypassing a medium voltage regulator during testing, the circuitry comprising:
   a low voltage regulator configured to, in operation, generate a first voltage within a first voltage range for powering first circuitry;
   a medium voltage regulator configured to, in operation, generate a second voltage within a second voltage range greater than the first voltage range for powering second circuitry;
   a low voltage regulator bypass circuit configured to generate a low voltage regulator bypass signal that operates to selectively bypass the low voltage regulator;
   a medium voltage regulator bypass circuit configured to bypass the medium voltage regulator as a function of the low voltage regulator bypass signal and an external voltage regulator select signal, the bypass of the medium voltage regulator being such that an external voltage can be applied to the second circuitry;
   wherein the medium voltage regulator bypass circuit comprises:
      an inverter configured to receive as input the external voltage regulator select signal; and
      an AND gate configured to receive as input an inverted version of the external voltage regulator select signal from the inverter and the low voltage regulator bypass signal, and to provide output to a power down terminal of the medium voltage regulator.

20. The circuit of claim 19, further comprising an external voltage terminal coupled to the second circuitry to receive an external voltage from a test tool that is wider in range than the second voltage range.

21. The circuit of claim 19, further comprising an external voltage terminal coupled to the second circuitry.

* * * * *

UNITED STATES PATENT AND TRADEMARK OFFICE
CERTIFICATE OF CORRECTION

PATENT NO. : 10,527,672 B2
APPLICATION NO. : 15/713168
DATED : January 7, 2020
INVENTOR(S) : Venkata Narayanan Srinivasan et al.

It is certified that error appears in the above-identified patent and that said Letters Patent is hereby corrected as shown below:

In the Claims

At Column 6, Claim Number 2, Line 27, please delete the word "being".

Signed and Sealed this
Twenty-second Day of September, 2020

Andrei Iancu
*Director of the United States Patent and Trademark Office*